US010755928B2

(12) United States Patent
Liu et al.

(10) Patent No.: US 10,755,928 B2
(45) Date of Patent: Aug. 25, 2020

(54) FABRICATING ELECTRICALLY NONCONDUCTIVE BLOCKS USING A POLYMER BRUSH AND A SEQUENTIAL INFILTRATION SYNTHESIS PROCESS

(71) Applicant: International Business Machines Corporation, Armonk, NY (US)

(72) Inventors: Chi-Chun Liu, Altamont, NY (US); Kristin Schmidt, Mountain View, CA (US); Yann Mignot, Slingerlands, NY (US); Martha Inez Sanchez, Menlo Park, CA (US); Daniel Paul Sanders, San Jose, CA (US); Nelson Felix, Slingerlands, NY (US); Ekmini Anuja De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/258,347

(22) Filed: Jan. 25, 2019

(65) Prior Publication Data

US 2020/0243335 A1    Jul. 30, 2020

(51) Int. Cl.
| | | |
|---|---|---|
| *H01L 21/033* | (2006.01) | |
| *H01L 21/02* | (2006.01) | |
| *H01L 21/311* | (2006.01) | |
| *H01L 21/3105* | (2006.01) | |

(52) U.S. Cl.
CPC ...... *H01L 21/0337* (2013.01); *H01L 21/0228* (2013.01); *H01L 21/02205* (2013.01); *H01L 21/0332* (2013.01); *H01L 21/0338* (2013.01); *H01L 21/31058* (2013.01); *H01L 21/31105* (2013.01); *H01L 21/31127* (2013.01)

(58) Field of Classification Search
CPC ............ H01L 21/0337; H01L 21/0338; H01L 21/31105; H01L 21/0332; H01L 21/31127; H01L 21/31058; H01L 21/0228; H01L 21/02205
See application file for complete search history.

(56) References Cited

U.S. PATENT DOCUMENTS

| | | |
|---|---|---|
| 8,980,418 B2 | 3/2015 | Darling et al. |
| 9,314,819 B2 | 4/2016 | Wilson et al. |
| 9,487,600 B2 | 11/2016 | Darling et al. |

(Continued)

FOREIGN PATENT DOCUMENTS

KR          20170069909 A      6/2017

*Primary Examiner* — Anthony Ho
(74) *Attorney, Agent, or Firm* — Robert Sullivan; Otterstedt, Wallace & Kammer, LLP (57) ABSTRACT

A plurality of mandrels and silicon dioxide spacer structures are formed, with the spacer structures interdigitated between the mandrels. An organic planarization layer is applied, as are a thin oxide layer and a layer of photoresist patterned in hole tone over the oxide layer, thereby defining a domain. At least one hole is etched in the thin oxide layer and the organic planarization layer to expose a portion of a hard mask layer surface between the spacer structures. A selective polymer brush is applied, which grafts only to the exposed hard mask surface, followed by solvent rinsing the domain to remove ungrafted polymer brush. At least one precursor is infused to an etch resistant material into the polymer brush by a sequential infiltration synthesis process. The organic planarization layer is ashed to convert the infused precursor into oxide form to further enhance etch selectivity to the hard mask layer.

20 Claims, 7 Drawing Sheets

(56) References Cited

U.S. PATENT DOCUMENTS

| | | |
|---|---|---|
| 9,646,883 B2 | 5/2017 | Brink et al. |
| 9,786,511 B2 | 10/2017 | Darling et al. |
| 2017/0170007 A1 | 6/2017 | Chan et al. |
| 2017/0330760 A1 | 11/2017 | Singh et al. |

FABRICATING ELECTRICALLY NONCONDUCTIVE BLOCKS USING A POLYMER BRUSH AND A SEQUENTIAL INFILTRATION SYNTHESIS PROCESS

BACKGROUND

The present invention relates generally to the electrical, electronic, and semiconductor arts and, more particularly, to semiconductor devices.

Edge placement error is currently a limiting factor impeding semiconductor scaling to smaller nodes. Forming pillars with small critical dimensions is especially challenging because of limitations of currently used etching materials, and small pillars with critical dimensions sometimes fail.

A selective atomic layer deposition (sALD) process has been developing for use in integrated circuit fabrication. Selective atomic layer deposition deposits material directly on selected surface areas of a wafer on which it is desired to have the material. The selective atomic layer deposition process has a very limited material selection as only a few atomic layer deposition precursors will work with surfaces on which they are deposited. High temperature (e.g., >400 C) is required in many sALD processes, which makes it difficult to be applied in backend-of-the-line (BEOL) semiconductor manufacturing processes. Furthermore, selective atomic layer deposition has not shown a sufficient degree of freedom in material selection and growth rate differences compared to other processes to be widely adopted commercially.

BRIEF SUMMARY

Techniques are provided for fabricating electrically nonconductive blocks using a polymer brush and a sequential infiltration synthesis process. In one aspect, an exemplary method for fabricating at least one back end of line electrically nonconductive block in a semiconductor structure includes providing a substrate on a wafer; forming a plurality of mandrels and silicon dioxide spacer structures, the spacer structures interdigitated between the mandrels; applying an organic planarization layer over the mandrels and spacer structures; applying a thin oxide layer and a layer of photoresist patterned in hole tone over the oxide layer, thereby defining a domain; etching at least one hole in the thin oxide layer and the organic planarization layer to expose a portion of a hard mask layer surface between the silicon oxide spacer structures; applying a selective polymer brush which will graft only to the exposed hard mask surface to the entire domain; solvent rinsing the domain to remove ungrafted polymer brush; infusing at least one precursor to an etch resistant material into the polymer brush by a sequential infiltration synthesis process; and ashing the organic planarization layer to convert the infused precursor into oxide form to further enhance etch selectivity to the hard mask layer.

In another aspect, an exemplary method for fabricating back end of line electrically nonconductive block patterns includes performing at least one step using a self-aligned block process; performing a selective brush and sequential infiltration synthesis step to infuse a precursor to an etch resistant material into a polymer to create electrically nonconductive blocks; and performing at least one additional processing step using a self-aligned block process.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. Moreover, it will be apparent to those skilled in the art given the teachings herein that numerous modifications can be made to the embodiments shown that are within the scope of the claims. No limitations with respect to the embodiments shown and described herein are intended or should be inferred.

Figure 1:
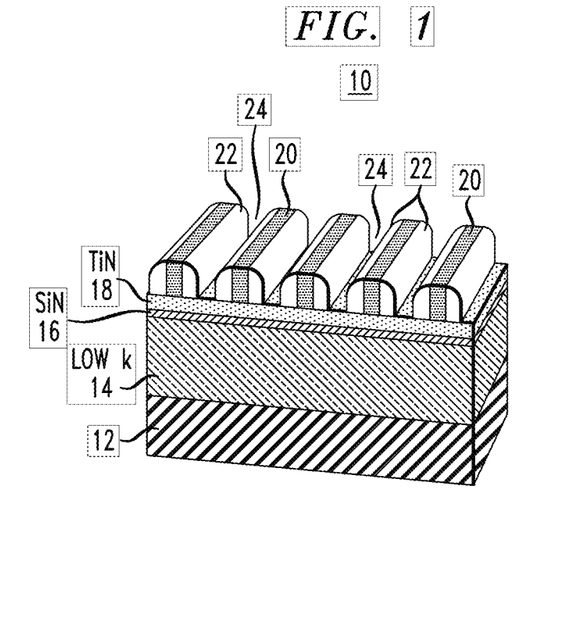
FIG. 1 is a perspective view cross-section of an exemplary, partially-fabricated, semiconductor structure illustrating an early stage in the fabrication of electrically nonconductive blocks with surface selective polymer brushes and a sequential infiltration synthesis process.

FIG. 1 illustrates a perspective view of an exemplary, partially-fabricated, semiconductor structure 10 in an early stage in the fabrication of electrically nonconductive blocks according to embodiments of the present invention. The partially-fabricated semiconductor structure 10 includes a substrate layer 12 which is one or more layers on a wafer. The substrate layer is a semiconductor material, in some embodiments, silicon. A dielectric layer 14 (e.g. low-k) is provided to be patterned into structures. A first hard mask layer 16 is provided beneath a second hard mask layer 18. Additional layers may be present. In some embodiments, the first hard mask layer 16 is silicon nitride (SiN) and the second hard mask layer 18 is titanium nitride (TiN). These layers can be formed of any known materials, and formed, for example, by conventional integrated circuit processing steps used to fabricate integrated circuits.

Note that certain elements are labeled in the drawings as "TiN," "SiN," "LOW k," and "OPL" for illustrative convenience, but can comprise other materials in other embodiments.

Embodiments of the present invention apply a selective polymer over the entire surface rather than applying a precursor only to surfaces on which it is desired to have the precursor. A polymer is selected to graft selectively to the surface of a specific material. A polymer brush can be a single polymer or a copolymer compound of two or more polymer components with a grafting group at one end. A polymer brush has a controllable surface selectivity determined by the grafting group. The polymer brush grafting is self-limiting due to the polymer being a linear polymer with only one grafting group per chain while the grafting group only reacts with the target surface under predetermined processing conditions. Only one mono-layer of the polymer is grafted on the surface. However, the brush layer thickness can be modified by changing the molecular weight of the polymer. For example, to make the polymer layer thicker, the molecular weight, hence the polymer chain length, can be made larger. Polymers that have characteristics suitable for application in one or more embodiments include, but are not limited to, poly (methyl methacrylate) (PMMA) and PVP (Poly (vinyl pyridine)). PVP includes at least P2VP and P4VP. These polymers can be selectively infused with metal precursors and become etch hard masks, including but not limited to aluminum oxide and cobalt oxide, later by a sequential infiltration synthesis (SIS) process. Thus, in one or more embodiments, PVP and PMMA are responsible for the selective absorption of the metal precursors, and surface grafting selectivity is determined by the end-functional group; the detailed chemical structure of the latter depends on which of a variety of vendors' products are used, as will be apparent to the skilled artisan from the teachings herein.

Figure 2:
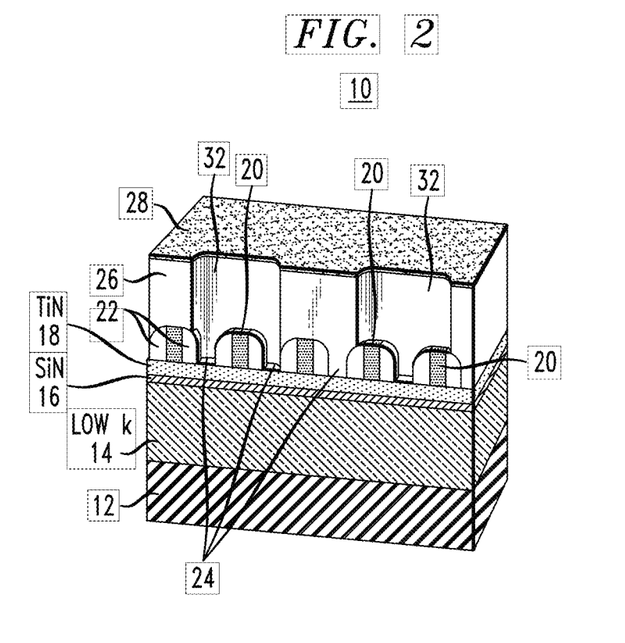
FIG. 2 is a perspective view cross-section of the exemplary structure in a subsequent stage of fabrication after depositing an organic planarization layer (OPL), lithography, and etch.

With continued reference to FIG. 1, and referring now also to FIG. 2, a self-aligned double patterning (SADP) process is used to fabricate a plurality of parallel mandrels 20 and spacer silicon dioxide structures 22. The mandrels 20 are fabricated of amorphous silicon by a low temperature physical vapor deposition (PVD) while the spacers 22 are made by a conformal atomic layer deposition (ALD) followed by a fluorine based etch of the silicon dioxide lands on the hard mask layer of the titanium nitride layer 18. In a typical dual damascene process, mandrel 20 will then be removed and both the spaces of 24 and 20 will be transferred into dielectric layer 14, where metal lines will be defined by filling the spaces with copper. The goal of a block structure is to effectively cut the metal lines; therefore, an additional feature in the space region is created before the etch of 18 to 14. In one or more embodiments of the invention, mandrel 20 is not yet removed at this stage compared to typical SADP-based dual damascene process because the blocks in 24 and those in 20 will be created separately in two lithography and etch steps.

A photo resist is a light sensitive material. A positive tone photo resist is a type of photo resist in which areas of the photoresist that are exposed to light, such as laser light or other suitable frequencies of light, becomes soluble to the photoresist developer. Areas of the photoresist that are not exposed to light remain insoluble to the photoresist developer. Conversely, a negative tone photoresist is a type of photoresist in which areas of the photoresist that are exposed to light become insoluble to the photoresist developer. The portions of the negative tone photoresist that are not exposed to light are soluble to the photoresist developer.

Without regard to whether a positive tone photoresist or a negative tone photoresist is used, a "hole tone" (also referred to as a tone-inverted block pattern(s)) processes an area within which the photoresist is soluble and subsequently removed by the photoresist developer. A subsequent etch results in a hole being etched. Similarly, without regard to whether a positive tone photoresist or a negative tone photoresist is used, a "pillar tone" results in a region within which areas of insoluble photoresist are surrounded by areas of soluble photoresist, such that when the soluble photoresist is removed by the photoresist developer, isolated sites of insoluble photoresist remain. A subsequent etch results in pillars remaining beneath the isolated sites of the insoluble photoresist surrounded by open space.

As seen in the FIG. 2 perspective view of the exemplary semiconductor structure 10, an organic planarization layer 26 has been applied and covered by an ALD or CVD oxide 28, and then patterned by lithography and etch steps. Embodiments of the present invention provide a method with a greater selection of deposition and substrate materials to create electrically non-conductive blocks than a typical selective atomic layer deposition process. The organic planarization layer (OPL) 26 is printed in "hole tone" targeting to create blocks in spaces 24 but not in mandrels 20. An electrically nonconductive block 30 (see FIG. 3) is a non-electrically conductive structure fabricated at one or more locations such as in one of the spaces 24 that will ostensibly be filled with a conductive material, in some embodiments copper, but for the electrically nonconductive block 30. The electrically nonconductive block 30 interrupts the copper, electrically isolating the copper and an associated electrical circuit on one side of electrically nonconductive block 30 from the copper and another electrical circuit on the opposite side of the same electrically nonconductive block 30. In subsequent fabrication steps, copper will be placed in spacers 22 illustrated in FIG. 2 as filled with the second organic planarization layer 26 material and also the spacers 22 currently filled with amorphous silicon occupied by the mandrels 20.

Figure 3:
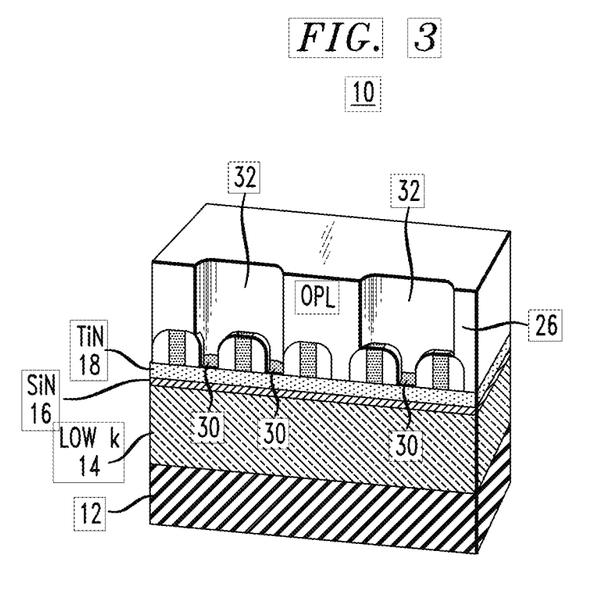
FIG. 3 is a perspective view cross-section of the exemplary structure in a subsequent stage of fabrication after an etch of short duration and formation of a first array of electrically nonconductive blocks.

Element 32 in FIGS. 2 and 3 refers to the openings in the whole OPL 26.

FIG. 3 illustrates a perspective view cross section through the exemplary semiconductor structure 10 after an etch of short duration to remove the thin oxide layer 28 from the OPL 26 and a small amount of the silicon dioxide spacers 22. A selective brush is coated over the entire structure but grafted only on exposed titanium nitride at approximately 120° C. with the main polymer being poly (methylmethacrylate) (PMMA), PVP (Poly(vinyl pyridine)), or equivalent. A subsequent solvent rinse removes the ungrafted brush material. A sequential infiltration synthesis (SIS) process step with an aluminum oxide precursor (in some embodiments tri-methyl aluminum) is carried out as a step in the process to infuse the polymer with a precursor material and ultimately turn the brush into an oxide of aluminum, such as aluminum oxide. An electrically nonconductive block 30 is an etch resistant structure fabricated at one or more locations such as in one of the spaces 24 that will prevent the etch of hard mask layer 18 to dielectric layer 14 later. Since the spaces in dielectric layer 14, derived from mandrels 20 and spaces 24, will eventually be filled with a conductive material, in some embodiments copper, except the locations where an electrically nonconductive block 30 has been fabricated. The electrically nonconductive block 30 effectively interrupts the copper, electrically isolating the copper and an associated electrical circuit on one side of electrically nonconductive block 30 from the copper and another electrical circuit on the opposite side of the same electrically nonconductive block 30.

The sequential infiltration synthesis (SIS) process step is an atomic layer deposition-like process which can be performed at relatively low temperatures, e.g., at temperatures below 100° C. and infuse an entire target polymer domain within a few atomic layer deposition cycles so the non-polymer domain area will have limited atomic layer deposition material applied thereto. The number of atomic layer deposition cycles may be less than 20 cycles, may be less than 10 cycles, may be less than 5 cycles, or may even be less than 3 cycles. The sequential infiltration synthesis process step enhances etch selectivity by infusing metallic material into a polymeric material.

A wet etch step that is sufficient to remove the $Al_2O_3$ from areas other than the polymer brushes is performed, i.e., $Al_2O_3$ remaining on the upper surface of electrically nonconductive blocks 30 in spaces 24 is sufficient to prevent the later TiN etching. Subsequently, the second organic planarization layer 26 is removed by ashing.

Figure 4:
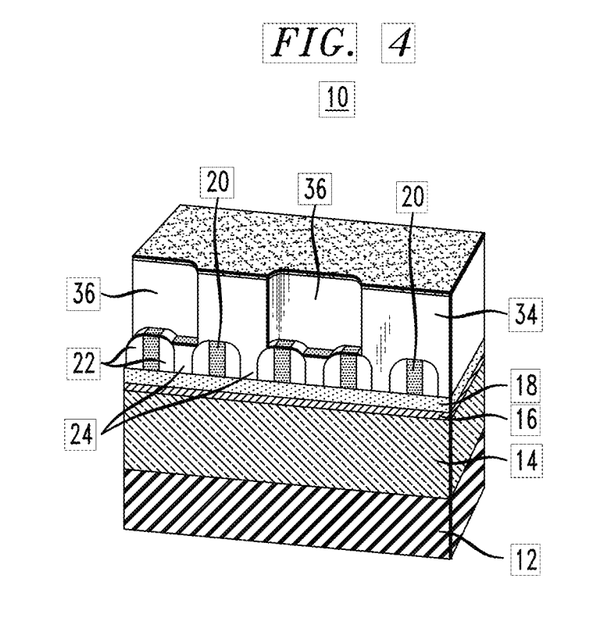
FIG. 4 is a perspective view cross-section through a different plane of the exemplary structure in a subsequent stage of fabrication in preparation to fabricate a second array of blocks.

FIG. 4 illustrates a perspective view cross section through the exemplary semiconductor structure 10. The cross section illustrated in FIG. 4 is through a different plane than illustrated in FIG. 3, for example, rearward of the plane of electrically nonconductive blocks 30 illustrated in the perspective of FIG. 3. The fabrication steps to form electrically nonconductive blocks 30 are repeated to form additional electrically nonconductive blocks targeting locations where portions of the mandrels 20 are currently located in FIG. 4.

Illustrated in FIG. 4 is a third organic planarization layer 34 and thin oxide patterned by lithography and etch process is shown in FIG. 2. The third organic planarization layer 34 is printed in "hole tone" targeting the amorphous silicon mandrels 20. A set of electrically nonconductive blocks will be fabricated where a portion of each of mandrels 20 are currently located on hard mask layer 18.

Figure 5:
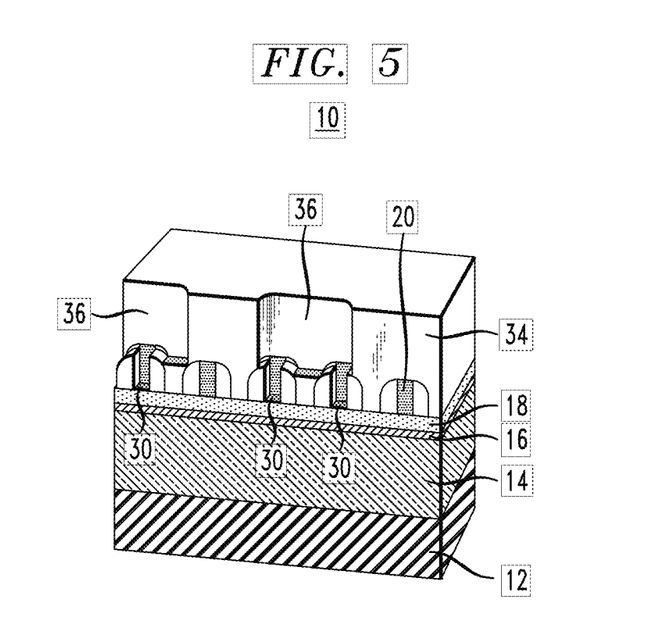
FIG. 5 is a perspective view cross-section of the exemplary structure in a subsequent stage of fabrication after depositing an organic planarization layer, lithography, and etch steps.

As illustrated in FIGS. 4 and 5, a partial etch of the third organic planarization layer 34 produces holes 36 which reveal the amorphous silicon mandrels 20 and some of the spacers 22 adjacent to mandrels 20 while leaving some of the third organic planarization layer 34 in spaces 24 to protect the titanium nitride hard mask layer 18 from a later amorphous silicon etch.

A mandrel-pull plasma etch, for example, with $SF_6$ and $O_2$ chemistry, removes the portion of amorphous silicon mandrels 20 exposed in holes 36 without attacking the underlying titanium nitride hard mask layer 18, because of the aforementioned partial OPL etch. This etch step removes a portion of the amorphous silicon of the respective mandrels 20 at the locations where one or more additional electrically nonconductive blocks 30 will be formed. An oxide etching, brush grafting, SIS process, and $Al_2O_3$ touch-up etch as described above with respect to FIG. 3 are performed. A touch-up etch to remove undesirable $Al_2O_3$, i.e. surfaces without polymer brushes before SIS, can be performed using wet chemical etch processes. The third organic planarization layer 34 is subsequently removed by an ashing process.

Figure 6:
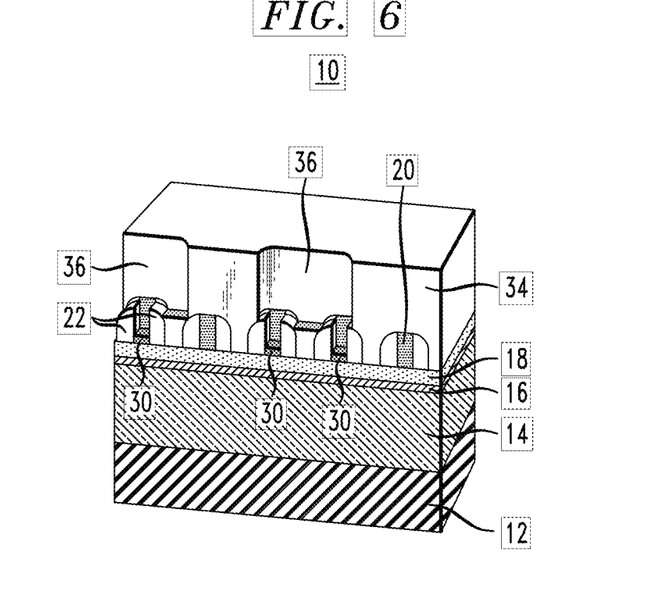
FIG. 6 is a perspective view cross-section of the exemplary structure in a subsequent stage of fabrication after brush grafting and a sequential infiltration synthesis process.

FIG. 6 illustrates a perspective view of the exemplary semiconductor structure 10 after brush grafting and a sequential infiltration synthesis process. Electrically nonconductive blocks 30 are fabricated where portions of mandrels 20 were previously. The organic planarization layer 34 is subsequently removed by an ashing process.

Figure 7:
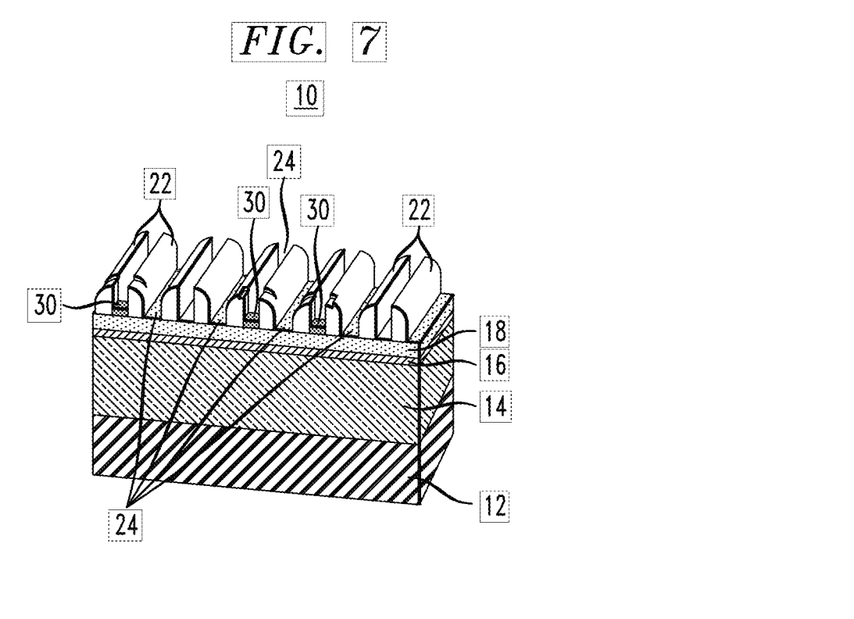
FIG. 7 is a perspective view cross-section of the exemplary structure in a subsequent stage of fabrication after depositing an organic planarization layer and mandrel removal.

FIG. 7 illustrates a perspective view of the exemplary semiconductor structure 10 after an $Al_2O_3$ touch-up etch, OPL ashing, as described above, and an amorphous silicon mandrel-pull is carried to remove the remaining amorphous silicon that formed the mandrels 20.

Figure 8:
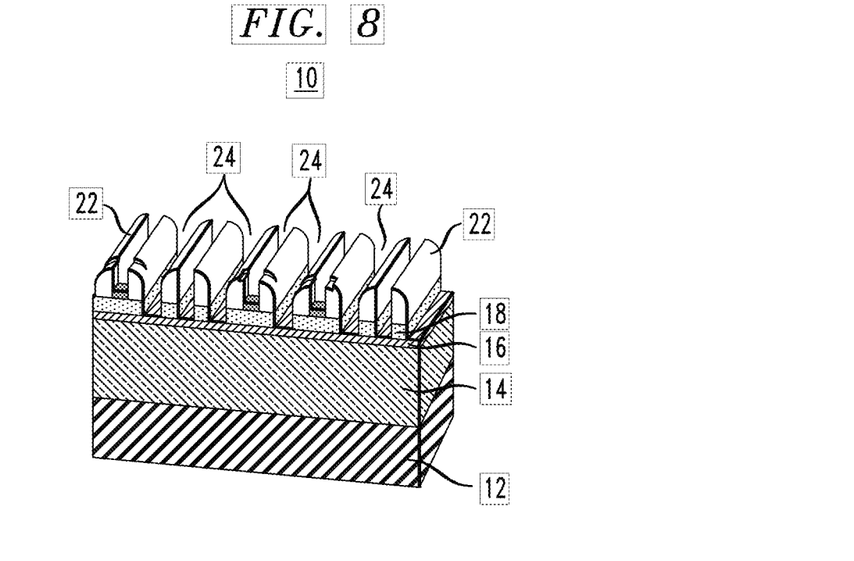
FIG. 8 is a perspective view cross-section of the exemplary structure in a subsequent stage of fabrication after transferring both the line and electrically nonconductive block patterns into the titanium nitride hard mask.

FIG. 8 illustrates a perspective view cross section through the exemplary semiconductor structure 10. A chlorine-based titanium nitride etch will transfer the union of the remaining spacers 24 and the patterns of the electrically nonconductive blocks into the hard mask layer 18, stopped by the silicon nitride layer 16. Where the hard mask layer 18 is covered by aluminum oxide, an electrically nonconductive block 30 will be formed in a subsequent processing step. A portion of the aluminum oxide could be removed by a chlorine based etch but the underlying titanium nitride in hard mask layer 18 will not be damaged. This step may be followed by other processing steps for via patterns, lithography, and etch steps as required for a particular integrated circuit design. In some embodiments the silicon nitride layer 16 remains and will be removed as part of, or after, a chemical mechanical polishing step.

Figure 9:
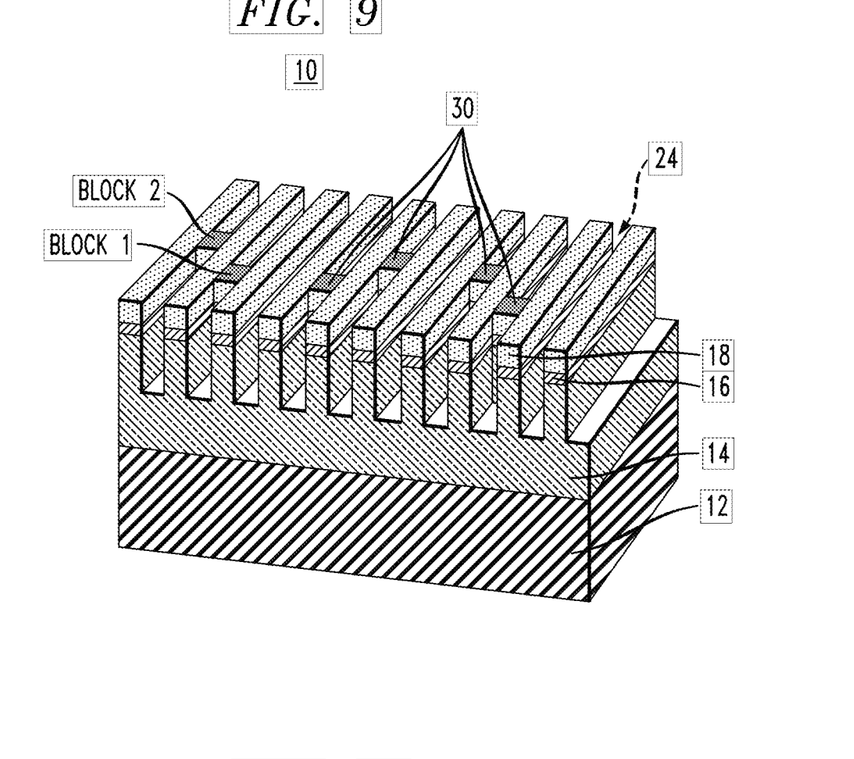
FIG. 9 is a perspective view cross-section of the exemplary structure in a subsequent stage of fabrication with metal patterns transferred from the hard mask into the dielectric layer.

FIG. 9 illustrates a perspective view cross section of the exemplary semiconductor structure 10 with two rows or arrays of electrically nonconductive blocks 30. One row or array of electrically nonconductive blocks 30 are fabricated in locations previously occupied by selected ones of mandrels 20. The other row or array of electrically nonconductive blocks 30 are fabricated in locations previously occupied by selected ones of spacers 22. Both rows or arrays of electrically nonconductive blocks 30 are visible after a silicon nitride etch and a dielectric etch have been completed. During the dielectric etch, portions of dielectric layer 14 are removed and spacers 22 are fully consumed thereby deepening spaces 24 into dielectric layer 14. Furthermore, in one or more embodiments, spacers 22 will be fully consumed during the dielectric etch.

Figure 10:
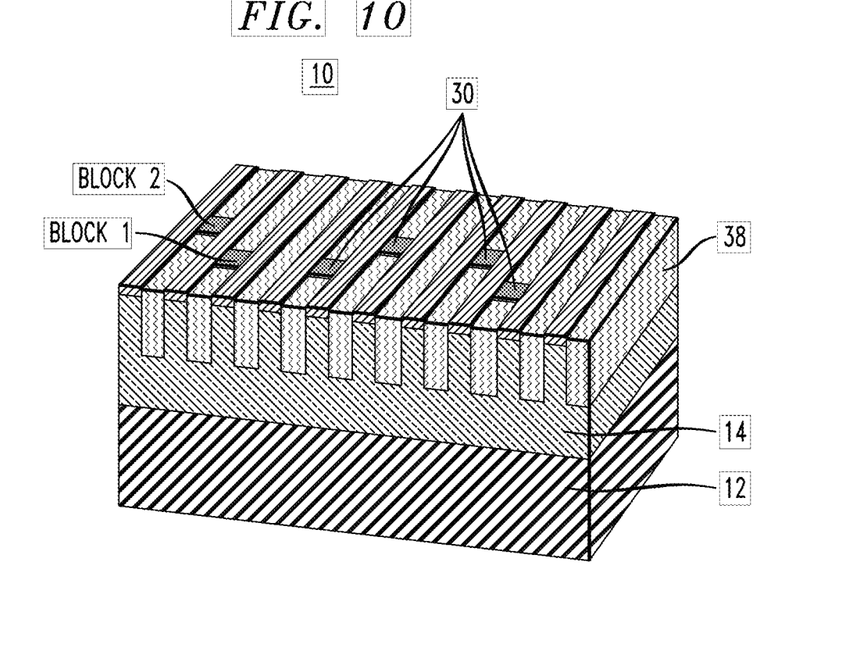
FIG. 10 is a perspective view cross-section of the exemplary structure in a subsequent stage of fabrication after copper has been deposited.

FIG. 10 illustrates a perspective view cross section of the exemplary semiconductor structure 10 after a wet etch titanium nitride removal of the remaining portions of the titanium nitride hard mask 18 as well as the aluminum oxide over the areas where electrically nonconductive blocks 30 are being formed. An optional silicon nitride etch to remove the remaining portions of layer 16 can be applied. A metallization process step deposits an electrically conductive material such as metal 38, in some embodiments copper as illustrated in FIG. 10, or cobalt, but not limited thereto, in spaces 24. The resulting electrically conductive material is isolated into segments by electrically nonconductive blocks 30 as necessary for interconnecting circuit elements as described above.

Preceding, intervening and subsequent processing steps develop the exemplary semiconductor structure 10 into a fabricated integrated circuit.

Figure 11:
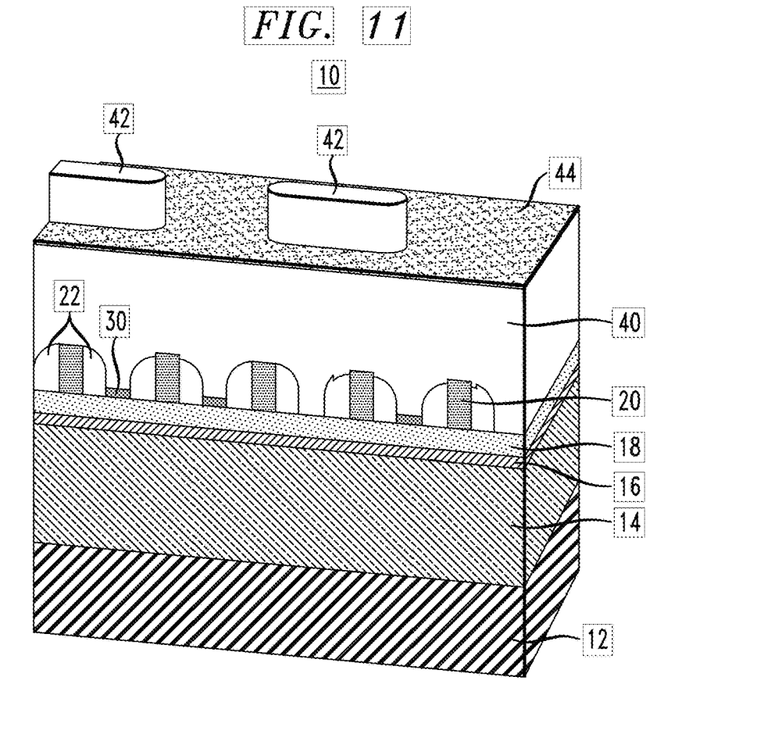
FIGS. 11, 12, and 13 are perspective view cross-sections of an exemplary structure fabricated by a sequence of processing steps some of which are application of a selective brush and sequential infiltration synthesis process followed by a "pillar tone" self-aligned block process.

Referring now also to FIG. 11, fabricating back end of line electrically nonconductive blocks 30 to isolate segments of electrically conductive interconnect conductors 38 that may be fabricated subsequent to fabrication of the electrically nonconductive blocks 30, utilizing one or more surface selective polymer brushes and a sequential infiltration synthesis process can also be used in conjunction with a self-aligned block process that uses pillars 42. In an embodiment where a row of electrically nonconductive blocks 30 has been fabricated, such as at the end of the fabrication steps described above with reference to FIG. 3, the second organic planarization layer 26 is ashed as described with respect to FIG. 3. Embodiments of the present invention use a selective brush with a "hole tone" pattern to fabricate electrically nonconductive blocks 30 to selectively interrupt conductors. In some embodiments, the conductors are copper; however, the conductors may be aluminum, gold, cobalt, or other metals, or conductive materials, as are known to one skilled in the art. In other embodiments, additional electrically nonconductive block patterns may be fabricated in a separate lithography step using "pillar tone" and etch directly, if the electrically nonconductive blocks 30 have large enough critical dimensions to prevent pattern collapse of the pillars.

Figure 12:
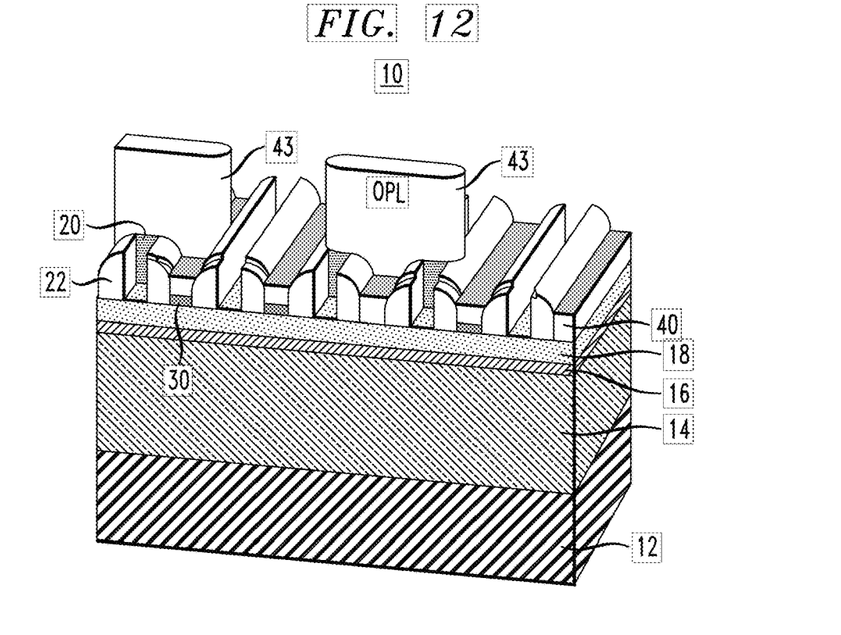
Figure 13:
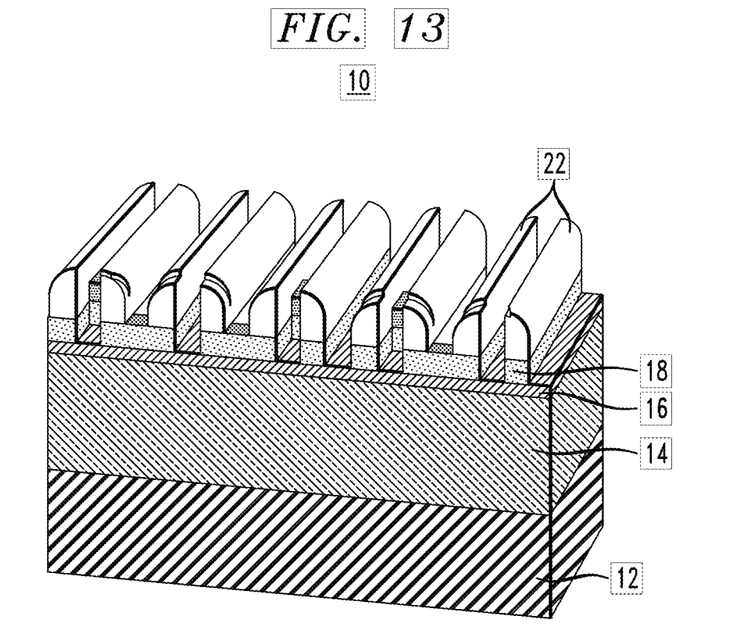

FIGS. 11, 12, and 13 are perspective view cross-sections fabricated by processing steps that combine a row or array of electrically nonconductive blocks 30 fabricated by brush and sequential infiltration synthesis process with another row or array of electrically nonconductive blocks 30 fabricated by a "pillar tone" (that is to say, two sets of blocks are made with lithographical shapes of inversed tone; "Pillar tone" refers to the physical shape—"pillars" or "island-like" or "inverted tone" are equivalent terms) self-aligned block process. FIG. 11 illustrates processing steps following removal of the third organic planarization layer 26 in FIG. 3. A fourth organic planarization layer 40 is deposited followed by the deposition of a thin oxide, normal SiARC, or the like, designated as 44 and a lithography patterning step in the "pillar tone."

The processing illustrated in the exemplary semiconductor 10 in FIG. 11 is preceded by the processing steps described in FIG. 1 through FIG. 3. After a first row or array of electrically nonconductive blocks 30 are fabricated as described in FIG. 3, and the second organic planarization layer 26 is removed by an ashing process, a fourth organic planarization layer 40 covered by a thin oxide and photoresist is printed in "pillar tone" as illustrated in FIG. 11 as a step fabricating another row or array of electrically nonconductive blocks 30. Although the first row or array of electrically nonconductive blocks 30 were fabricated in spaces 24 formerly occupied by mandrels 20, and the second row or array of electrically nonconductive blocks 30 were fabricated in spaces 24 between two silicon dioxide spacers 22 where there was no mandrel 20, the order of which spaces are used to fabricate a first row or array of electrically nonconductive blocks 30 and a second row or array of electrically nonconductive blocks 30 makes no difference.

As illustrated in FIG. 12, a partial etch of the fourth organic planarization layer 40 and a thin oxide etch reveals amorphous silicon of mandrels 20 and retains pillars 43 of the fourth organic planarization layer over regions of silicon where a second row or array of electrically nonconductive blocks 30 are being formed. A chlorine-based mandrel pull removes the exposed amorphous silicon mandrels 20. The retained portions of mandrels 20 that were covered by the pillars are fabricated to be a row or an array of electrically nonconductive blocks 30 in subsequent processing steps. Note that pillars 42 in FIG. 11 are the pillar structures in resist while the pillars 43 in FIG. 12 are the pillar structures in the OPL.

FIG. 13 illustrates the exemplary semiconductor 10 after the pillars 42 and other remaining portions of the fourth organic planarization layer 40 were removed by ashing and an etch opened the titanium nitride hard mask 18 to the silicon nitride layer 16 below.

In one or more embodiments, when the pillars 42 are so small that they are unstable, rather than using a pillar 42, a reverse tone hole is used.

The processing step sequence continues in accordance with the processing steps described with respect to FIG. 9.

While an exemplary process for fabricating electrically nonconductive blocks 30 has been described herein as forming two rows of electrically nonconductive blocks, forming electrically nonconductive blocks is neither limited to row formation of electrically nonconductive blocks nor limited to two rows of electrically nonconductive blocks if the electrically nonconductive blocks are formed in rows. The electrically nonconductive blocks are formed in one or more arrays as needed on each layer of fabrication where electrically nonconductive blocks are formed to isolate segments of electrically conductive interconnect conductors 38 on the same layer. Which electrically nonconductive blocks are concurrently formed in a sequence of processing steps on a given metal layer is determined by which electrically nonconductive blocks can be fabricated using the same processing steps to fabricate electrically nonconductive blocks to isolate segments of electrically conductive interconnect conductors 38 on the same metal layer.

Embodiments of the present invention are compatible with the self-aligned block process in that the aspects of the invention can be used to fabricate a first one or more rows or arrays of electrically nonconductive blocks and the self-aligned block process can be used to fabricate subsequent one or more rows or arrays of electrically nonconductive blocks. Alternatively, the self-aligned block process can be used to fabricate one or more rows or arrays of electrically nonconductive blocks and aspects of the invention can be used to fabricate a subsequent one or more rows or arrays of electrically nonconductive blocks using the self-aligned block process. The etch stop selectivity of one or more embodiments is compatible with and can be used in conjunction with a self-aligned block process. For example, use of a selective brush and sequential infiltration synthesis can be used to fabricate electrically nonconductive blocks in one or more rows or in one or more arrays on each of one or more levels of back end of line integrated circuit fabrication, depending on the complexity of the integrated circuit being fabricated, and a self-aligned block process can be used to fabricate a subsequent or preceding one or more rows, or one or more arrays, one or more levels of back end of line integrated circuit fabrication.

As described above, a sequential infiltration synthesis process is compatible with and can be used in conjunction with a self-aligned block process. A sequential infiltration synthesis process can be selectively used before self-aligned block process steps, after self-aligned block process steps, or between self-aligned block process steps. Similarly, self-aligned block process steps can be selectively used before sequential infiltration synthesis process steps, after sequential infiltration synthesis process, or between self-aligned block process steps.

The embodiments disclosed herein may be used to provide electrically nonconductive blocks in conductors interconnecting devices and other features and structures on a single metal layer integrated circuit, as well as, providing electrically nonconductive blocks in interconnect conductors 38 interconnecting devices and other features and structures on multiple level metal layer integrated circuits.

Some embodiments provide a method for fabricating back end of line electrically nonconductive blocks in rows or arrays using a selective brush polymer in lithographically-defined regions. Holes may be fabricated instead of pillars using steps of a sequential infiltration synthesis process to fabricate the electrically nonconductive blocks. Compatible self-aligned block process steps may be used before or after the sequential infiltration synthesis process steps.

Some embodiments provide a method for fabricating at least one back end of line electrically nonconductive block in a semiconductor structure. A plurality of mandrels and interdigitated spacer structures between the mandrels are provided on a substrate of a wafer. An organic planarization layer is applied over the mandrels and spacer structures in "hole tone" defining a domain. At least one hole is etched in the organic planarization layer to expose a hard mask in a spacer structure. A selective polymer brush is applied to the entire domain. A precursor to an etch resistant material is selectively infused into the polymer brush by a sequential infiltration synthesis process. The organic planarization layer is ashed converting the precursor to an etch resistant material on the surface of the exposed hard mask where at least one electrically nonconductive block is lithographically defined. Compatible self-aligned block process steps may be used before or after the sequential infiltration synthesis process steps.

It is to be appreciated that the features shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

At least a portion the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products.

A semiconductor structure in accordance with aspects of the present invention can be employed in essentially any application and/or electronic system. Given the teachings provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method for fabricating at least one back end of line electrically nonconductive block in a semiconductor structure, comprising:
   providing a substrate on a wafer;
   forming a plurality of mandrels and silicon dioxide spacer structures, the spacer structures interdigitated between the mandrels;
   applying an organic planarization layer over the mandrels and spacer structures;
   applying a thin oxide layer and a layer of photoresist patterned in hole tone over the oxide layer, thereby defining a domain;
   etching at least one hole in the thin oxide layer and the organic planarization layer to expose a portion of a hard mask layer surface between the silicon oxide spacer structures;
   applying a selective polymer brush which will graft only to the exposed hard mask surface to the entire domain;
   solvent rinsing the domain to remove ungrafted polymer brush;
   infusing at least one precursor to an etch resistant material into the polymer brush by a sequential infiltration synthesis process; and
   ashing the organic planarization layer to convert the infused precursor into etch resistant oxide form.

2. The method of claim 1, wherein the polymer brush is poly (methyl methacrylate) (PMMA).

3. The method of claim 1, wherein the polymer brush is P2VP (Poly (2-vinyl pyridine)).

4. The method of claim 3, wherein the hard mask layer comprises titanium.

5. The method of claim 1, wherein the at least one precursor to an etch resistant material is an aluminum oxide precursor.

6. The method of claim 5, wherein the aluminum oxide precursor is tri-methyl aluminum.

7. The method of claim 1, wherein a precursor to an etch resistant material is infused into the entire polymer domain.

8. The method of claim 7, wherein the precursor is infused within a few atomic layer deposition cycles.

9. The method of claim 8, wherein the precursor is infused within twenty atomic layer deposition cycles.

10. The method of claim 8, wherein the precursor is infused within three atomic layer deposition cycles.

11. The method of claim 7, wherein at least one electrically nonconductive block pattern is formed as holes and tone-inverted subsequent to selectively infusing the precursor to an etch resistant material.

12. A semiconductor structure made in accordance with the method of claim 11.

13. A semiconductor structure made in accordance with the method of claim 11, wherein the semiconductor structure is an integrated circuit.

14. A method for fabricating back end of line electrically nonconductive block patterns, comprising:
    performing at least one step using a self-aligned block process;
    performing a selective brush and sequential infiltration synthesis step to infuse a precursor to an etch resistant material into a polymer to create electrically nonconductive blocks; and
    performing at least one additional processing step using a self-aligned block process.

15. The method of claim 14, wherein the additional processing step using a self-aligned block process fabricates an additional array of electrically nonconductive blocks.

16. An integrated circuit made in accordance with the method of claim 15.

17. The method of claim 14, wherein the hard mask surface comprises titanium.

18. The method of claim 17, wherein the titanium comprises titanium nitride.

19. The method of claim 14, wherein the at least one precursor to an etch resistant material is an aluminum oxide precursor.

20. The method of claim 19, wherein the aluminum oxide precursor is tri-methyl aluminum.

* * * * *